United States Patent [19]

Yonezawa et al.

[11] Patent Number: 4,561,009
[45] Date of Patent: Dec. 24, 1985

[54] SEMICONDUCTOR DEVICE

[75] Inventors: Toshio Yonezawa, Yokosuka; Masaharu Aoyama, Yokohama, both of Japan

[73] Assignee: Tokyo Shibaura Denki Kabushiki Kaisha, Japan

[21] Appl. No.: 554,336

[22] Filed: Nov. 22, 1983

Related U.S. Application Data

[62] Division of Ser. No. 166,182, Jul. 7, 1980, Pat. No. 4,433,004.

[30] Foreign Application Priority Data

Jul. 11, 1979 [JP] Japan .................................. 54-87717
Jul. 11, 1979 [JP] Japan .................................. 54-87718

[51] Int. Cl.⁴ .................. H01L 21/283; H01L 23/54; H01L 23/08
[52] U.S. Cl. ........................................ 357/67; 357/73; 357/71
[58] Field of Search ............................ 357/67, 71, 73; 148/DIG. 118; 428/620, 632, 639, 469

[56] References Cited

U.S. PATENT DOCUMENTS

| 3,702,427 | 11/1972 | Learn et al. ......................... 174/68.5 |
| 3,716,469 | 2/1973 | Bhatt et al. ........................... 357/67 |
| 3,725,309 | 1/1969 | Ames et al. ...................... 357/67 X |
| 3,759,798 | 1/1970 | Graff et al. ...................... 357/71 X |
| 4,017,890 | 4/1977 | Howard et al. ....................... 357/68 |
| 4,151,545 | 4/1979 | Schnepf et al. ...................... 357/71 |

FOREIGN PATENT DOCUMENTS

| 0042926 | 1/1982 | European Pat. Off. . |
| 48-42034 | 12/1973 | Japan . |
| 51-91336 | 8/1976 | Japan . |
| 0023281 | 2/1977 | Japan .................................. 357/71 |
| 0117551 | 3/1977 | Japan .................................. 357/71 |
| 53-17287 | 2/1978 | Japan . |
| 0033057 | 3/1980 | Japan .................................. 357/71 |
| 0120162 | 9/1980 | Japan .................................. 357/71 |
| 0138859 | 10/1980 | Japan .................................. 357/71 |

OTHER PUBLICATIONS

"Segmented Stripe Devices", Ainslie et al., IBM Tech. Bulletin, vol. 13, No. 7, Dec. 1970, pp. 2011–2013.
Electrotransport in Aluminium–Leiterbahnenhern et al., vol. 48, (1975), Wiss. Ber. AEG–Telefunken, pp. 46–54, (German Reference).
"Long-Life Aluminum Alloy Thin-Film Conductors'-'-d'Heurle et al.–IBM Technical Disclosure Bulletin, vol. 15, No. 1, 6–1972, pp. 348–349.
Howard et al., "Intermetallic Compounds of Al and Transition Metals: . . . ", J. Appl. Phys. 49(7), Jul. 1970, pp. 4083–4095.
"Wissenschaftliche Berichte AEG-Telefunken, vol. 48 (1975), issue 2/3, pp. 46 to 54.
Silvestri, "Formation of $Al_2O_3$ From Porous Aluminum . . . ", IBM Technical Disclosure Bulletin, vol. 20, No. 9, Feb. 1978, pp. 3714–3716.
Comizzoll, "RCA Review", vol. 37, issue 4 (Dec. 1976), pp. 483 to 490.

Primary Examiner—Andrew J. James
Assistant Examiner—Sheila V. Clark
Attorney, Agent, or Firm—Finnegan, Henderson, Farabow, Garrett & Dunner

[57] ABSTRACT

A semiconductor device is disclosed which includes a semiconductor substrate; a metal wiring layer comprising an Al alloy formed on the surface of this substrate; and an alumina layer covering this metal layer and containing at least one metal selected from the group consisting of Cu, Mg, Ni, Cr, Mn, Ti and Y. A method for manufacturing such a semiconductor device is also disclosed.

9 Claims, 16 Drawing Figures

SEMICONDUCTOR DEVICE

This is a division of application Ser. No. 166,182, filed July 7, 1980.

BACKGROUND OF THE INVENTION

The present invention relates to a semiconductor device with an improved wiring structure.

Aluminum, which is generally used as a wiring metal for semiconductor devices, has defects such as disconnections due to electromigration caused when the pattern of a wiring metal layer is made very fine or disappearance of the junction due to an extraneous process of alloying between Al and the Si substrate caused when the diffusion layer in a semiconductor substrate (e.g. silicon substrate) is shallow. However, the most serious defect is the problem of corrosion. Corrosion is caused by the gradual chemical or electrical corrosion of the Al wiring due to the presence of water which has been unavoidably trapped inside during the manufacture of the semiconductor device or which has entered from outside the package when the semiconductor device is rendered conductive in a general manner.

In order to solve this problem, it has been conventionally proposed to form a passivation film consisting of phosphor doped glass (PSG) on the Al wiring so as to prevent water from entering the Al wiring area from the outside and to facilitate the elimination of corrosion of the Al wiring. However, the formation of PSG requires a temperature of about 400° C. Due to this heat, a number of hillocks (projections) are formed on the Al wiring, and these hillocks other cause the generation of pinholes and cracks, thus disabling the function of the passivation film. Further, PSG itself absorbs humidity easily and generates a small amount of phosphoric acid, thus adversely facilitating the corrosion of the Al wiring which is in contact with the PSG.

SUMMARY OF THE INVENTION

In order to eliminate these problems of the prior art, the present inventors have studied the problems and have found that the generation of hillocks, and thus the generation of pinholes and cracks and the corrosion of the Al wiring may be prevented by forming the wiring with an Al alloy such as Al-Cu instead of pure Al and by forming an alumina film on this wiring including at least one metal selected from the group consisting of Cu, Mg, Ni, Cr, Mn, Ti and Y. As a result, a semiconductor device with wiring which is less susceptible to corrosion and which is more reliable has been realized due to the stable and effective passivation of the alumina film containing the above-mentioned metal, and due to the improvement in resistance of the wiring obtained by the mutual function of the alumina film and the wiring consisting of an Al alloy.

The present invention provides, in one aspect, a semiconductor device which is characterized in that an alumina layer containing at least one metal selected from the group consisting of Cu, Mg, Ni, Cr, Mn, Ti and Y is formed on a metal wiring layer comprising an Al alloy which in turn is formed on the surface of a semiconductor substrate.

DESCRIPTION OF THE PREFERRED EMBODIMENTS

The wiring of the present invention consists of an Al alloy with which the formation of hillocks during heat treatment is less as compared with the wiring consisting of pure Al. Such an Al alloy may be Al-Cu, Al-Cu-Si, Al-Mg, Al-Ni, Al-Cr, Al-Mn, Al-Ti, Al-Y and so on.

The alumina layer of the present invention formed on the wiring functions as a passivation layer which has a blocking property for water and Na. In addition to alumina, it includes at least one metal selected from the group consisting of Cu, Mg, Ni, Cr, Mn, Ti and Y which are excellent in blocking property against water and Na. Among the above-mentioned metals, Cu is especially excellent in the blocking property. It is, therefore, advantageous to use an alumina containing Cu as a passivation layer. A method for forming such an alumina layer may be a method in which an alumina layer containing the above-mentioned metal is deposited by RF sputtering or plasma CVD on the wiring, or a method in which a pure alumina layer is first formed by RF sputtering or plasma CVD, and then the above-mentioned metal is ion-implanted in this alumina layer. The former method is advantageous in that it involves only one step for forming an alumina layer including the above-mentioned metal. The latter, although it involves two steps, is advantageous in that the amount of the metal to be added to the alumina layer may be precisely controlled. The amount of the metal to be added to the alumina layer may not be exactly defined due to differences in the blocking properties of each metal, but is preferably generally in the range of 0.05–3.0%. The thickness of the alumina layer is 500–15,000 Å, and more preferably 1,000–4,000 Å.

The oxidizing treatment of the metal wiring layer in accordance with the method of the present invention serves two functions: It transforms the surface of the metal wiring layer into alumina which consists of Al and at least one metal selected from the above-mentioned group, and it also helps to diffuse the metal in the Al alloy into the alumina for facilitating the formation of the alumina layer containing the above metal. The oxidizing method may be:

(1) oxidizing the surface layer of the wiring by anodic oxidation with ethylglycollic solution of ammonium borate, (2) oxidizing the surface layer of the wiring by the anodic oxidation with a water solution of oxalic acid or chromic acid, (3) oxidizing the surface layer of the wiring by high temperature thermal oxidation in a wet atmosphere. In the method (1), a non-porous alumina layer containing the above metal is formed on the wiring and in the method (3) a porous alumina layer containing the above metal is formed. The methods (1) and (2) using anodic formation as the oxidizing treatment means are especially advantageous in that an alumina layer containing the above metal may be formed on the wiring at a temperature which is close to the ordinary temperature, the formation of hillocks on the wiring consisting of an Al alloy may be prevented with precision, and the generation of pinholes and cracks in the alumina layer may be prevented.

In the method of the present invention, when the amount of the metal contained in the alumina layer formed on the wiring layer formed by the oxidizing treatment is small, ions of a metal such as Cu and Ni may be ion-implanted in the alumina layer so as to form an alumina layer containing a predetermined amount of the metal.

Examples of the present invention will now be described with reference to the accompanying drawings.

EXAMPLE 1

Figure 1A:
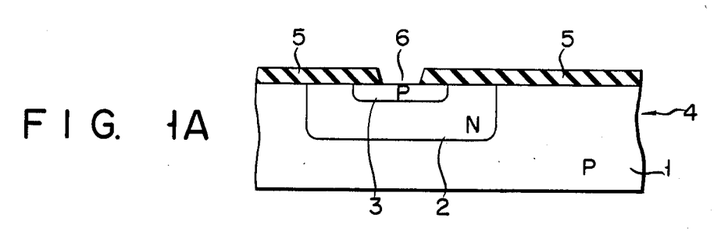
FIGS. 1(A)–1(C) and FIG. 2 are sectional views illustrating the manufacturing steps of a bipolar transistor in accordance with an embodiment of the present invention.

A silicon oxide layer 5 was formed on a main surface of a silicon substrate 4 consisting of a collecter 1, a base 2 and an emitter 3. A contact hole 6 was formed in the part of oxide layer 5 above the emitter 3 FIG. 1(A). Thereafter, an Al alloy layer of 1.0 μm in thickness which consisted of Al-2%Si-2%Cu was formed on the entire surface of the silicon oxide layer 5, and this layer was patterned (selectively etched) so as to form wiring 7 of an Al alloy which was in ohmic contact with the emitter 3 (FIG. 1(B)). The Si substrate was submerged in a 6% oxalic acid water solution. A constant current formation was performed at an initial electric current density of 3-4 mA/cm$^2$ using the Si substrate as an anode and a Pt electrode arranged in opposition to this substrate as a cathode. As the electric current density decreased the constant voltage formation was performed at 25 V to complete an anodic oxidation treatment of about 8 minutes. As a result, an alumina layer 8, 2,000 Å in thickness and containing 0.8% Cu, was formed on the top surface and the side surfaces of the wiring 7 as shown in FIG. 1(C). A bipolar transistor was obtained from this by forming an opening (not shown) on the alumina layer 8 for connection of an electrode.

EXAMPLE 2

Figure 1B:
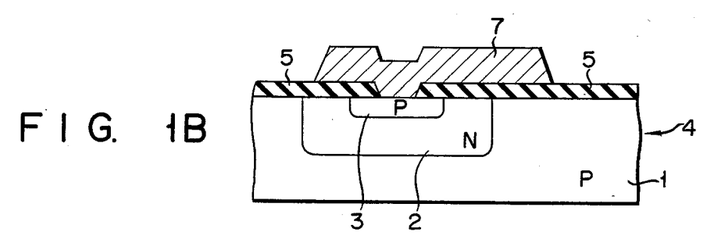
Figure 1C:
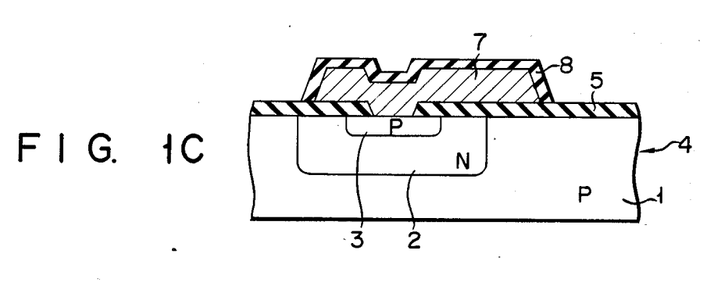
Figure 2:
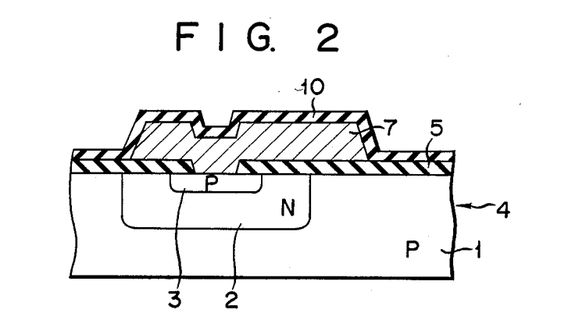

The substrate shown in FIG. 1(B) was first prepared. This semiconductor substrate was placed in a magnetron sputtering device with an orthogonal electromagnetic field. An alumina target containing a Cu oxided substance was used as a sputtering source. After the chamber was evacuated to a pressure on the order of $1\times10^{-6}$ Torr, Ar gas was charged into the chamber to about $3.0\times10^{-3}$ Torr. Sputtering was performed for 20 minutes with an input below 2.2 kW and a reflection power of below 10 W from a high frequency power source of 13.56 MHz. Consequently, the growing speed was about 100 Å/min. An alumina layer 10, 2,000 Å in thickness and containing 0.8% Cu, was formed on the top surface and side surfaces of the wiring 7 and on the oxide layer 5 (FIG. 2). A bipolar transistor was obtained by forming an opening (not shown) in the alumina layer 10 for connecting an electrode.

Figure 3:
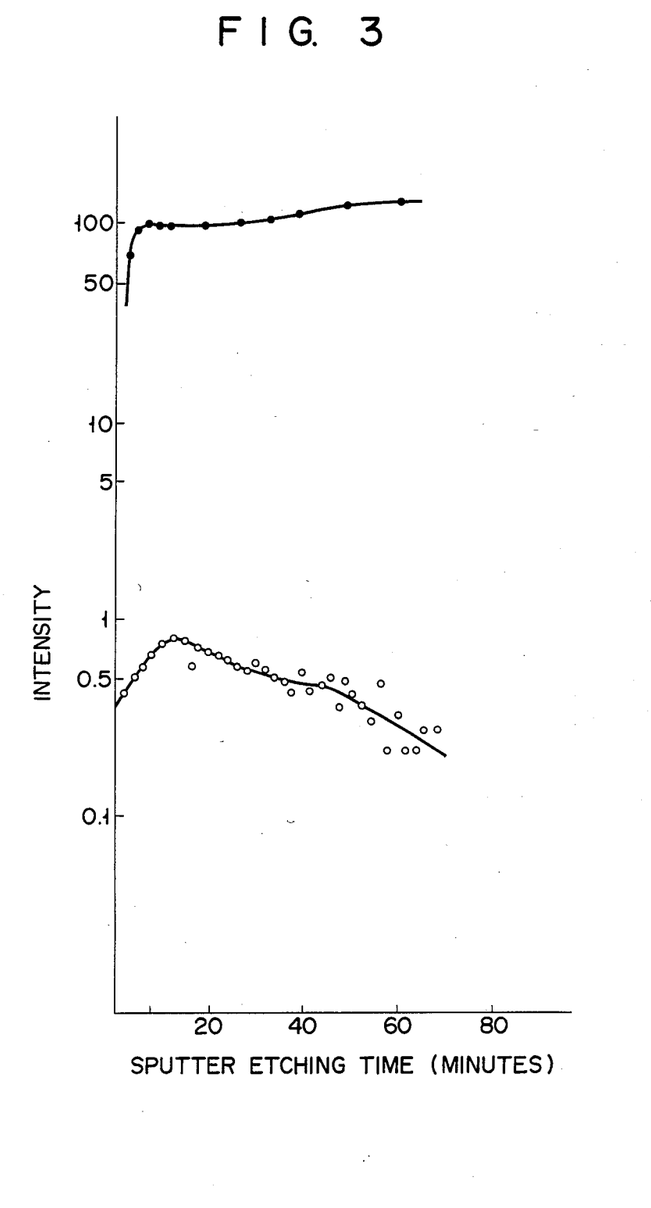
FIG. 3 is a graph illustrating a characteristic curve representing the blocking property of the wiring of a conventional bipolar transistor against Na.
Figure 4:
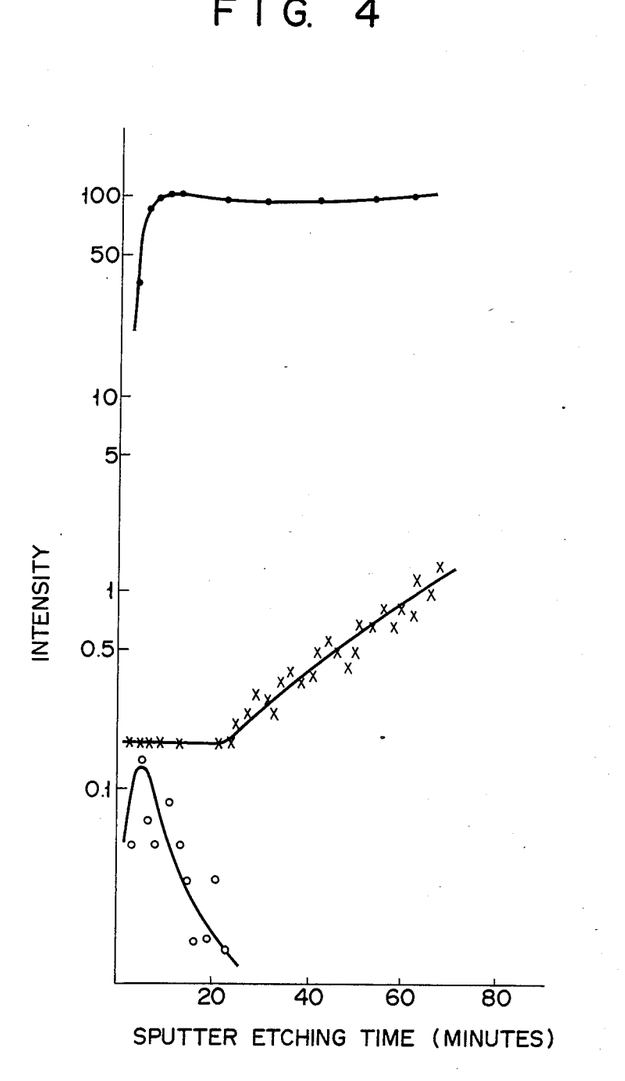
FIG. 4 is a graph illustrating a characteristic curve representing the blocking property of the wiring of a bipolar transistor of an embodiment of the present invention against Na.

The transistor of Example 1 and a bipolar transistor (Comparative Example 1) with a wiring structure in which an alumina layer is formed on wiring consisting of pure Al were placed in a furnace heated to a temperature of 500° C. and vaporizing NaCl for two hours to forcibly contaminate both sets of wiring. Sputter etching of the wirings by Ar ions was then performed, and the exposed part of each set of wiring was analyzed by an ion micro-mass analyzer (I.M.M.A.) for examining the blocking property against Na. As a result, the transistor of Comparative Example 1 showed a blocking characteristic curve as shown in FIG. 3, and the transistor of the Example 1 the present invention showed a blocking characteristic curve as shown in FIG. 4. In FIGS. 3 and 4, the line with solid dots is the strength characteristic curve for Al, the line with hollow dots is the strength characteristic curve for Na, and the line marked with x's is the strength characteristic curve for Cu. As may be apparent from FIGS. 3 and 4, the amount of Na which entered the wiring is by far less in the case of the transistor of the present invention than the conventional transistor (Comparative Example 1). Further, the Na only entered the surface layer of the wiring in the transistor of the present invention. This proves the superior blocking property against Na of the transistor of the present invention.

Figure 5:
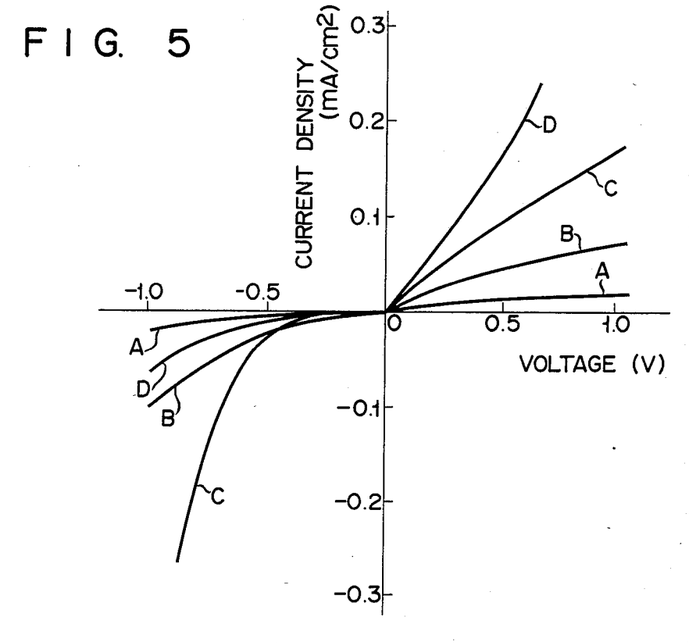
FIG. 5 is a graph showing polarizing characteristic curves of the wiring of a conventional transistor and that of the present invention.
Figure 6:
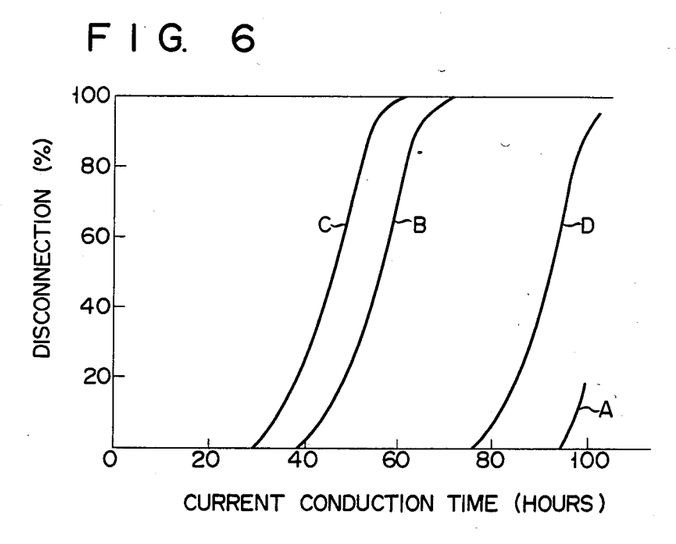
FIG. 6 shows characteristic curves representing the defective connection rate of the wiring of the conventional transistor and the transistor of the present invention caused by corrosion.

The polarizing characteristics in a 850 ppm phosphoric acid water solution are shown in FIG. 5 for the wiring of the transistor of Example 1 of the present invention, the transistor of Comparative Example 1, a bipolar transistor (Comparative Example 2) having wiring which is 1.0 μm in thickness and consists of pure Al, and a bipolar transistor (Comparative Example 3) having wiring which is 1.0 μm in thickness and consists of an Al alloy of Al-2%Si-2%Cu. The occurrence rate of disconnections of the transistors of Example 1 and Comparative Examples 1-3 were tested when they were made electrically conductive at a high temperature of 121° C. and a high pressure of 2 atmospheres. The results are shown in FIG. 6. In FIGS. 5 and 6, curves A are characteristic curves for the transistor of Example 1; curves B are for Comparative Example 1; curves C are for Comparative Example 2; and curves D are for Comparative Example 3. As may be apparent from FIG. 5, the wiring of the transistor of the present invention presented a smaller electric current density, less tendency to corrode, and a smaller rate of occurrence of disconnections (as may be seen from FIG. 6) as compared with the transistors of Comparative Examples 1-3.

Further, it was found that the noise index (dB) was extremely small in the case of the transistor of the example of the present invention.

This improvement in the prevention of corrosion of the wiring is not limited to wiring consisting of an Al alloy containing Cu or a combination of this wiring with an alumina layer containing Cu formed on this wiring; this improvement was similarly noted in wiring of an Al alloy on which was formed an alumina layer containing a metal such as Mg, Ni, Cr, Mn, Ti and Y. Characteristic views similar to those shown in FIGS. 3-6 were obtained for Example 2 as in the case of Example 1, thus supporting the advantageous effects of the present invention over the transistors of Comparative Examples.

Figure 7:
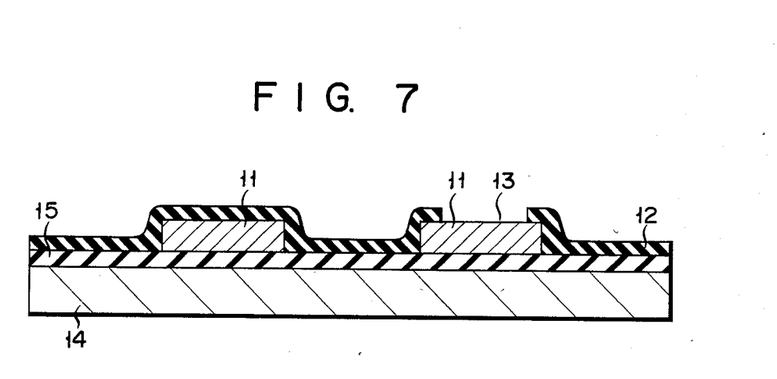
FIGS. 7 and 8(A)–8(C) are sectional views illustrating the method of the present invention for forming openings for connecting an electrode.

FIG. 7 shows a case in which an alumina layer 12 containing a metal additive such as Cu or Mg is formed on Al alloy wiring 11, and an opening 13 for connecting an electrode is formed thereafter. The alumina layer 12 is formed by the RF sputtering method to a thickness of 3,000 Å, and it is etched using a photoresist (not shown) as a mask in a mixed acid of phosphoric acid (1,000 cc), chromium trioxide (500 g), and water (3,000 cc). Since the Al alloy layer 11 is hard to each, the alumina layer 12 may be etched sufficiently. FIG. 7 illustrates a case in which the opening 13 for connecting an electrode is formed and the resist is removed. In the figure, numeral 14 denotes an Si substrate and numeral 15 denotes an $SiO_2$ layer, respectively.

Figure 8A:
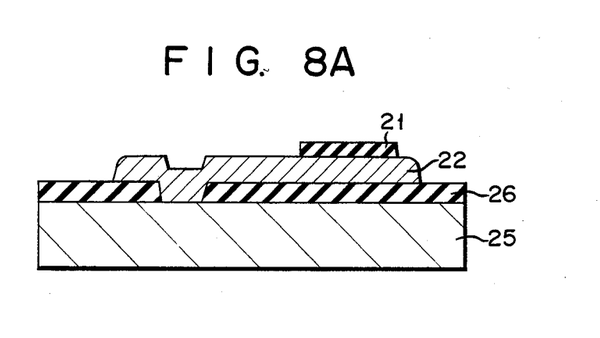
Figure 8B:
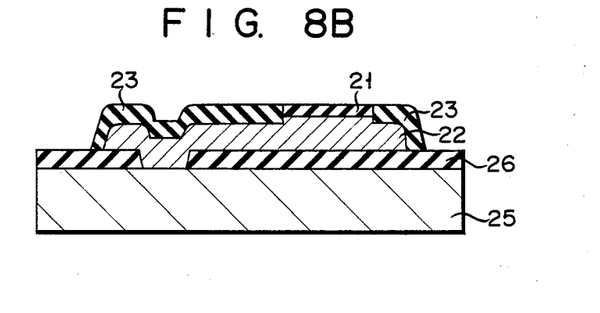
Figure 8C:
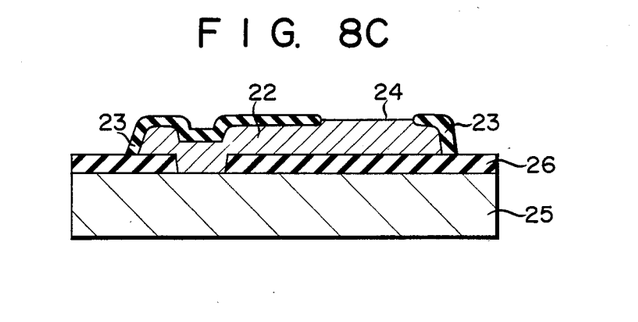

FIGS. 8(A)-8(C) illustrate a case in which the opening for connecting an electrode is formed without etching the alumina layer. Before proceeding with a step of transforming the surface layer of the wiring alone into alumina by anodic oxidation and so on after the formation of the Al alloy wiring, a plasma CVD $Si_3N_4$ layer 21 is selectively formed on an electrode part 22 so that the alumina layer 23 does not grow under the $Si_3N_4$ layer 21 and is formed on the surface of the exposed Al alloy wiring part alone (FIG. 8(B)). Thereafter, the $Si_3N_4$ layer 21 is selectively removed in a plasma of a mixed gas of $CF_4$-$O_2$ and an opening 24 for connecting an electrode is thus formed FIG. 8(C). Numerals 25 and 26 in the figures show an Si substrate and an $SiO_2$ layer, respectively.

Figure 9A:
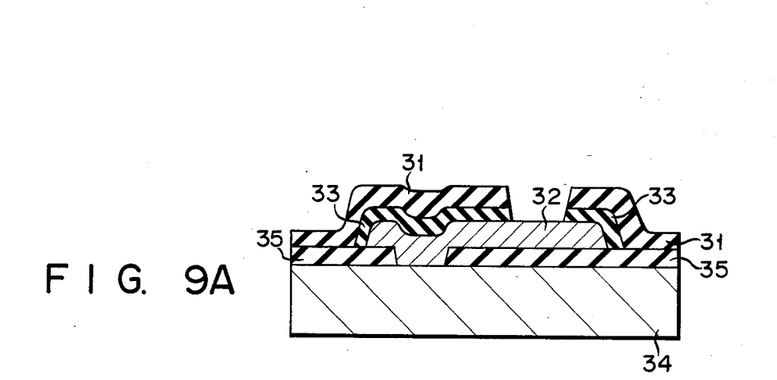
FIGS. 9(A)–9(B) and FIGS. 10–11 are sectional views illustrating the examples of the present invention for combining the alumina layer with other passivation layers.
Figure 9B:
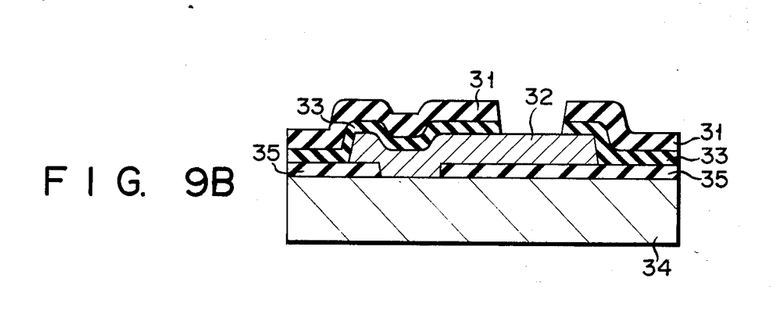

FIGS. 9(A) and 9(B) show a case in which the alumina layer is used in combination with other passivation layers. After forming an alumina layer 33 by anodic formation or the RF sputtering method, an $SiO_2$ layer or a phosphor-doped oxide layer (PSG) 31 is superposed by the CVD method thereover. An opening for connecting an electrode is formed by selectively removing the superposed $SiO_2$ or PSG layer 31 and etching the alumina layer 33 immediately above an electrode 32 using the $SiO_2$ or PSG layer 31 as a mask. The superposed $SiO_2$ layer 31 provides sufficient electrical insulation. Thus, a relatively thin alumina layer 33 of less than 1,000 Å in thickness shows effective corrosion resistance. This results in a shortening of the formation process of the alumina layer and the etching process. FIG. 9(A) shows a case in which a alumina layer is formed by anodic formation, and FIG. 9(B) shows a case in which an alumina layer is formed by the RF sputtering method. Numerals 34 and 35 in the figures denote an Si substrate and an $SiO_2$ layer, respectively.

Figure 10:
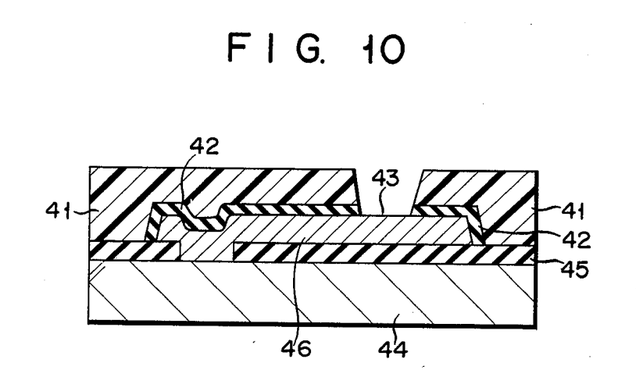

FIG. 10 shows a case in which an alumina layer is used in combination with an organic insulating layer of a material such as polyimide. When the electrode material has especially great stress, cracks may form on a passivation layer of a material such as $SiO_2$ formed on the alumina layer, disabling the protection of the electrode material. In contrast to this, the stress of an organic insulating layer 41 of a material such as polymide as shown in FIG. 10 is very small, and it is possible to form a layer of considerable thickness such as $2\mu$-$5\mu$ on an alumina layer 42. When the polyimide resin, for example, is spinned on (rotary coating), it makes the surface of the electrode wiring or the substrate extremely even as shown in FIG. 10. An opening 43 for connecting an electrode may be formed by selectively removing the polyimide resin 41 by hydrazine hydrate and etching the alumina layer 42, or by forming an opening in the alumina layer 42 in advance, coating polyimide 41 thereafter and finally forming an opening in the polyimide layer 41. Numerals 44 and 45 in the figure denote an Si substrate and an $SiO_2$ layer, respectively.

Figure 11:
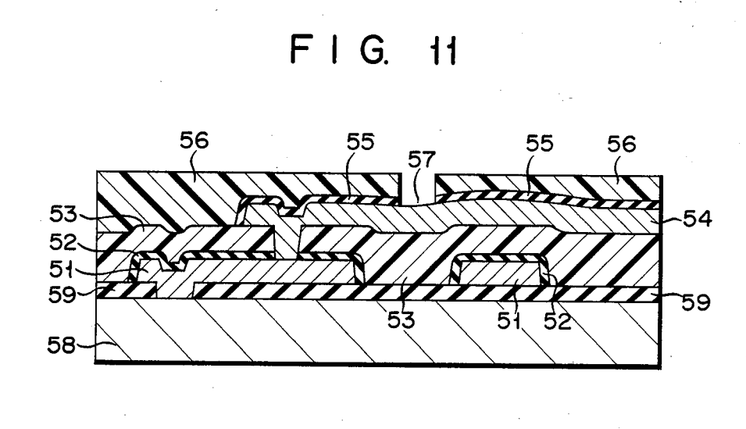

This improvement in the prevention of corrosion of an Al alloy electrode by an alumina layer containing a metal additive is also applicable to a multi-layered wiring structure by forming a plurality of electrode layers through an insulating layer of alumina alone or alumina with $SiO_2$, $Si_3N_4$, polyimide and so on and forming an alumina protective layer on the upper electrode as has been described. For example, after forming a layer construction as shown in FIG. 11, an Al alloy electrode is selectively formed. An alumina layer having a metal additive such as Cu and Mg and a polyimide layer are continuously formed on the electrode, and an opening for connecting an electrode is formed. FIG. 11 shows a two-layer wiring construction, and electrode wiring with improved corrosion resistance of over three layers may be formed by the combination of repetition of this process. In FIG. 11, numeral 51 denotes a first Al alloy; 52, a first alumina layer; 53, a polyimide layer; 54, a second Al alloy layer; 55, a second alumina layer; 56, a second polyimide layer; 57, an opening for connecting an electrode; 58, an Si substrate; and 59, an $SiO_2$ layer.

In summary, in accordance with the present invention, a semiconductor device with wiring having improved corrosion resistance, fewer disconnections, and improved reliability is provided by forming an alumina layer containing at least one metal selected from the group consisting of Cu, Mg, Ni, Cr, Mn, Ti and Y on wiring consisting of an Al alloy so as to facilitate stable and effective passivation by the alumina layer and to improve corrosion resistance of the wiring due to the mutual relation of the alumina layer and the wiring consisting of an Al alloy. A method for manufacturing such a semiconductor device is also provided.

What is claimed is:

1. A semiconductor device comprising a semiconductor substrate; a metal wiring layer comprising an Al alloy formed on the surface of said substrate; and means for blocking water and Na, said means comprising an alumina layer covering said metal layer and containing at least one metal selected from the group consisting of Cu, Mg, Ni, Cr, Mn, Ti and Y.

2. A semiconductor device comprising a semiconductor substrate; an insulating layer formed on the surface of said substrate and having an opening; a metal wiring layer connected through said opening to said semiconductor substrate and comprising an Al alloy; means for blocking water and Na, said means comprising an alumina layer formed on the surface of said metal layer and containing at least one metal selected from the group consisting of Cu, Mg, Ni, Cr, Mn, Ti and Y; and an opening formed in said alumina layer for connecting an electrode.

3. A semiconductor device as claimed in claim 1 or 2 wherein said Al alloy is Al-Cu, Al-Cu-Si, Al-Mg, Al-Ni, Al-Cr, Al-Mn, Al-Ti, or Al-Y.

4. A semiconductor device as claimed in claim 2 wherein said alumina layer is continuously formed on said insulating layer.

5. A semiconductor device as claimed in claim 2 wherein said semiconductor substrate is made of silicon and said insulating layer is made of silicon dioxide.

6. A semiconductor device as claimed in claim 2 wherein an organic insulating layer is formed on the surface of said semiconductor substrate having said alumina layer.

7. A semiconductor device as claimed in claim 1 or 2 wherein said semiconductor device comprises a transistor.

8. A semiconductor device as claimed in claim 1 or 2 wherein said semiconductor device comprises a diode.

9. A semiconductor device as claimed in claim 1 or 2 wherein said semiconductor device comprises an integrated circuit device.

* * * * *